(12) United States Patent
Lamb

(10) Patent No.: US 6,483,389 B1
(45) Date of Patent: Nov. 19, 2002

(54) PHASE AND FREQUENCY DETECTOR PROVIDING IMMUNITY TO MISSING INPUT CLOCK PULSES

(75) Inventor: Jonathan Lamb, Ringwood (GB)

(73) Assignee: Semtech Corporation, Newbury Park, CA (US)

(*) Notice: Subject to any disclaimer, the term of this patent is extended or adjusted under 35 U.S.C. 154(b) by 0 days.

(21) Appl. No.: 09/911,643

(22) Filed: Jul. 19, 2001

Related U.S. Application Data (60) Provisional application No. 60/287,229, filed on Apr. 27, 2001.

(51) Int. Cl.[7] .............................................. H03D 13/00
(52) U.S. Cl. ................................ 331/25; 327/3; 327/12
(58) Field of Search ....................... 327/2, 3, 7, 8, 327/9, 10, 12; 331/25

(56) References Cited

U.S. PATENT DOCUMENTS

| | | | |
|---|---|---|---|
| 4,819,081 A | * | 4/1989 | Volk et al. ..................... 327/12 |
| 6,198,355 B1 | * | 3/2001 | Lindquist et al. .............. 327/12 |
| 6,304,116 B1 | * | 10/2001 | Yoon et al. .................... 327/12 |
| 6,323,692 B1 | * | 11/2001 | Tsinker ......................... 327/12 |

* cited by examiner

*Primary Examiner*—Tuan T. Lam
(74) *Attorney, Agent, or Firm*—Thelen Reid & Priest LLP; David B. Ritchie (57) ABSTRACT

An improvement to a phase and frequency detector (PFD) employs an additional reset control that acts to effectively reset the registers that generate the phase indicator signals if an undesirable preconditioned state has been entered. The additional reset control signal is generated by a register that is enabled upon detection of the preconditioned state. The new reset control signal is activated upon detection of a synchronizing signal, that is based on an input source signal, while the enable control is active. The improved detector can allows a phase locked loop (PLL) system locking to the nearest input reference clock edge and it can provide immunity to missing input clock edges.

24 Claims, 5 Drawing Sheets

FIG. 1

PRIOR ART

PRIOR ART

PHASE AND FREQUENCY DETECTOR PROVIDING IMMUNITY TO MISSING INPUT CLOCK PULSES

CROSS-REFERENCE TO RELATED APPLICATION

This application claims priority based on U.S. Provisional Application Ser. No. 60/287,229, filed Apr. 27, 2001.

FIELD OF THE INVENTION

This invention relates to a modification of a phase and frequency detector (PFD) in order to correct an undesirable preconditioned state resulting from a missing input clock source.

BACKGROUND OF THE INVENTION

Figure 1:
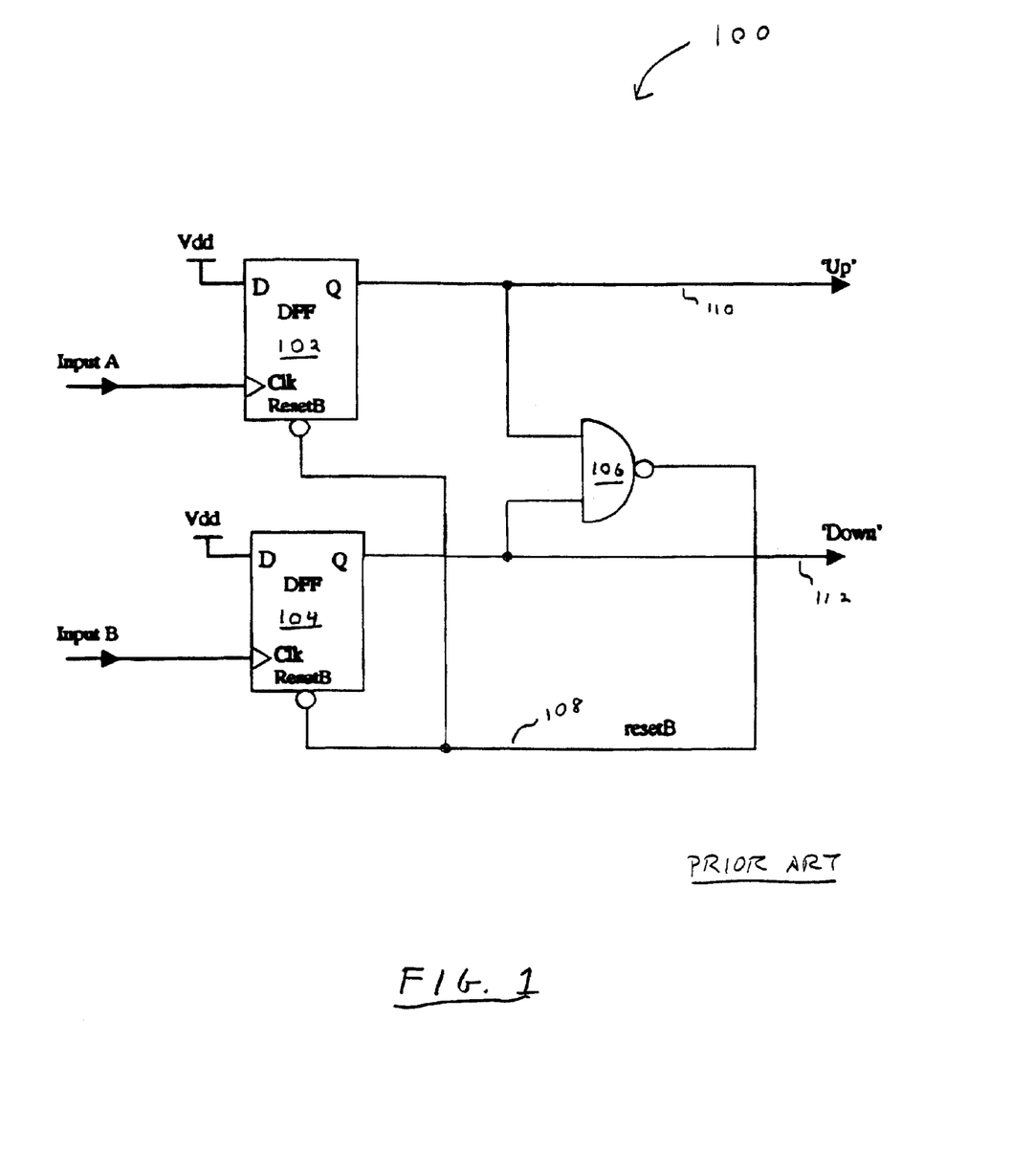
FIG. 1 is a schematic block diagram illustrative of a prior art phase and frequency detector (PFD).

Phase Locked Loop (PLL) implementations typically employ some variation of a phase and frequency detector (PFD) circuit to facilitate the adjustments needed to lock the system output clock to an input reference clock. A standard PFD that is commonly used because of its simplicity and accuracy is shown in FIG. 1 and is indicated by the general reference character 100. The intent is to allow the PLL to operate smoothly and with minimal phase disturbances, even when there are missing pulses on the input reference clock signal. This occurrence is common in modem communications networks where more than one input reference signal may be used and where each may correspond to different switches and routers operating under unique clock regimes. As packets, for example, are passed from one router to the next, the synchronizing clock information of the first router may also be passed to the second router for data or flow control purposes. Alternatively, one clock source may fail and there may be a system integrity requirement to switchover to another input reference source.

The PFD utilized as part of the overall PLL design must be equipped to efficiently handle the missing input source scenario. It is also desirable for the circuit to operate so that its resulting phase capture range is minimized. If the range is too large, it will take much longer for the PLL to lock on to the input reference clock. This can be the case for even only a single missing input reference clock pulse.

Once again referring to FIG. 1, the basic operation of the system 100 is well known and understood in the art. The essential features of this approach during normal operation will now be described.

The circuit 100 includes D-type flip-flop registers 102 and 104. The first register 102 receives the first input source, INPUT A, as its clk-input. The D-input of register 102 is connected to the positive supply voltage, VDD. The Q-output of register 102 connects to first phase indicator signal 110, UP. The second register 104 receives the second input source, INPUT B, as its clk-input. The D-input of register 104 is connected to the positive supply voltage, VDD. The Q-output of register 104 connects to the second phase indicator signal 112, DOWN. The two phase indicator signals, UP and DOWN, are also inputs to NAND-gate 106. The output of the NAND-gate is the active-low reset control signal 108, RESETB, and this connects to the reset-inputs of registers 102 and 104. There may also be additional delay along with the NAND-gate operation to assure sufficient RESETB pulse width.

Figure 2:
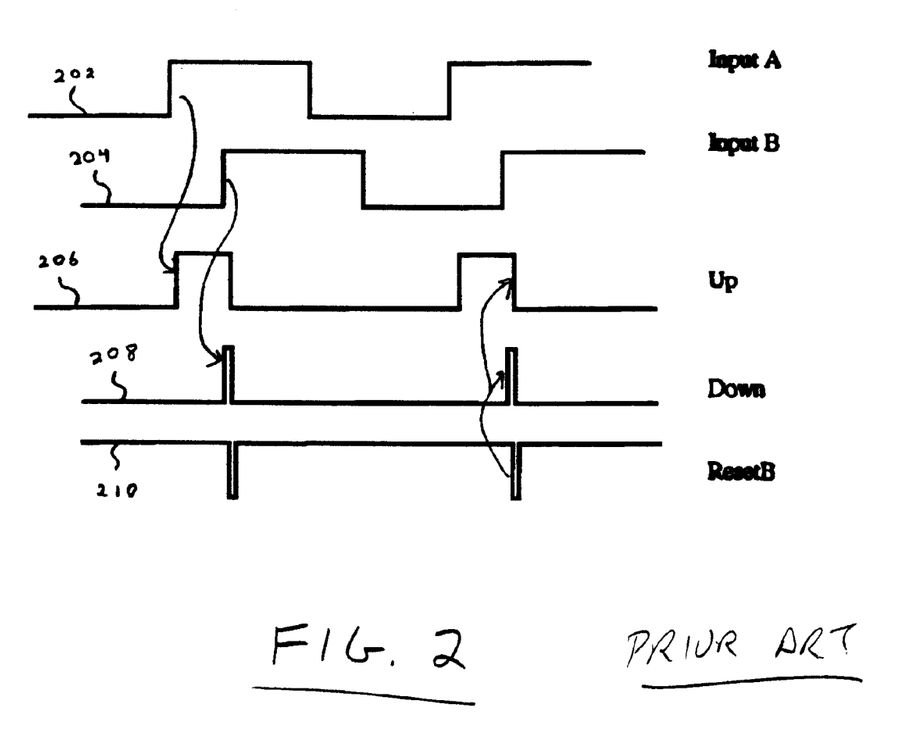
FIG. 2 is a timing diagram illustrative of the normal operation of the prior art PFD of FIG. 1.

FIG. 2 shows a timing diagram corresponding to the normal operation of the PFD of FIG. 1, and these figures should be viewed together. The INPUT A waveform 202 is shown with a phase difference relative to the INPUT B waveform 204. The UP phase indicator waveform 206 goes high upon detection of the INPUT A rising edge. This is the D-type flip-flop operation when the D-input is connected to a logic high state. Similarly, the DOWN phase indicator waveform 208 goes high upon detection of the INPUT B rising edge. Because of the NAND-gate 106 function, the reset control signal waveform 210 goes low and this causes registers 102 and 104 to discharge (i.e., reset) phase indicator signals UP and DOWN, respectively.

A problem with the PFD of FIG. 1 is that the normal phase capture range is essentially +/−360 degrees. For the case of a missing input reference clock pulse (i.e., input source), or any number of pulses, this circuit gets into a preconditioned state near −360 degrees. The ramification for the PLL is that it will attempt to move its phase lock position by nearly an entire clock cycle in order to match the input reference clock. This is an undesirable situation because it will cause the PLL to take more time to lock by using an inefficient path and it can also lead to unnecessary phase disturbances.

The undesirable preconditioned state will now be described with reference to both FIG. 1 and FIG. 3.

Figure 3:
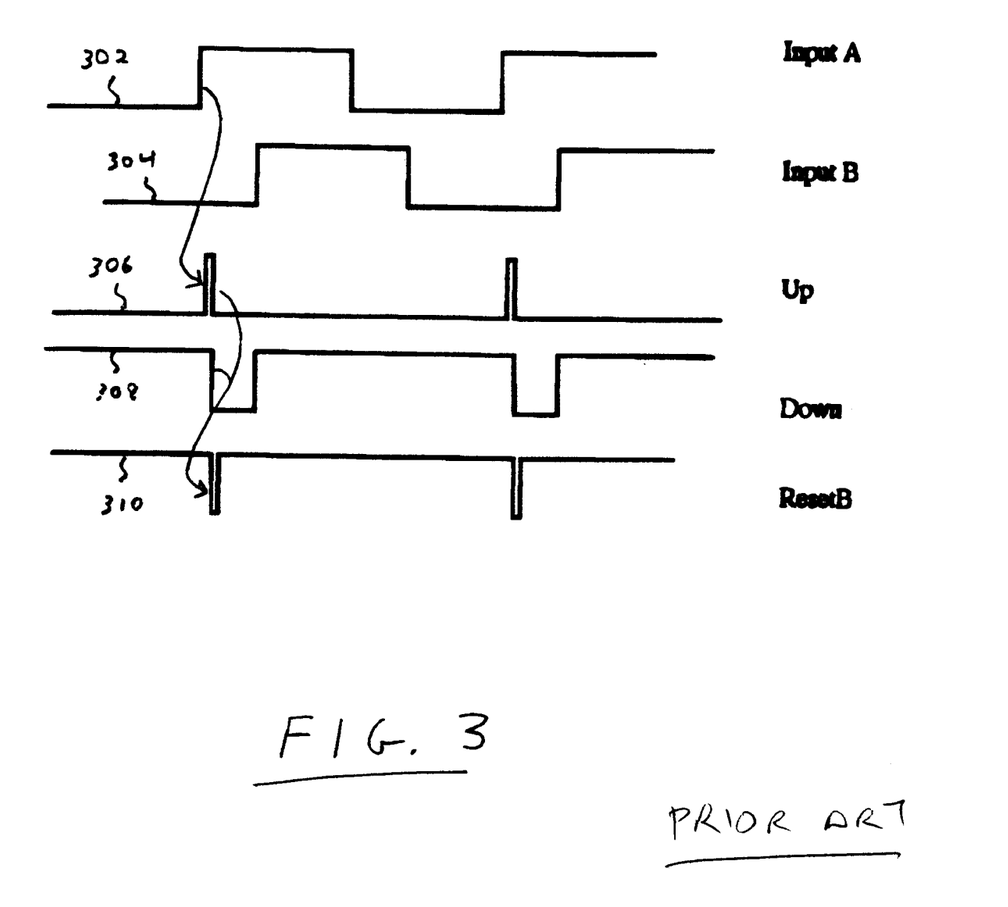
FIG. 3 is a timing diagram illustrative of the undesirable preconditioned state operation of the prior art PFD of FIG. 1.

In FIG. 3, the INPUT A waveform 302 is shown along with the INPUT B waveform 304. In this scenario, the INPUT A waveform has the same relative position as illustrated in FIG. 2, but after some previous missing pulse high (i.e., missing clock pulse). The first phase indicator signal, UP, waveform 306 goes high upon the rising edge of INPUT A, as also in the example case of FIG. 2. However, the second phase indicator signal, DOWN, waveform 308 remains stuck high prior to the INPUT B rising edge. This is due to a missing reset control pulse resulting from the missing INPUT A pulse. Without the INPUT A rising edge to activate the first phase indicator signal, UP, that input to the NAND-gate 106 of FIG. 1 remains low. This forces the reset control signal 108 to remain in its inactive high state. Thus, the second phase indicator signal, DOWN, remains high for a longer duration because it is not reset by the reset control signal, indicated by its associated waveform 310, activating until the following rising edge of INPUT A. As shown in FIG. 3, the circuit remains in this preconditioned state of inverted DOWN signal operation due to the improper resetting of the registers.

It would be desirable to arrive at some way of providing phase and frequency detection and control that would allow for missing input clock pulses with minimal phase disturbances and high PLL locking efficiency by ensuring that the PFD does not enter the undesirable preconditioned state.

SUMMARY OF THE INVENTION

A phase and frequency detector (PFD) utilizes three registers and a control circuit. The first register receives a first input source and a first reset control signal and it outputs a first phase indicator signal. The second register receives a second input source and a second reset control signal and it outputs a second phase indicator signal. The third register receives an enable control signal and a synchronizing signal, which may be an inverted version of the second input source, and it outputs a second reset control signal. The control circuit receives the first phase indicator signal, the second phase indicator signal, and the second reset control signal and outputs the first reset control signal.

A reset operation on all registers occurs when a missing input reference source pulse has been detected. This causes the enable control signal to go high and activates the second reset control signal. This second reset control signal then activates the first reset control signal, regardless of the states of the first and the second phase indicator signals. The PFD then returns to normal operation upon the activation of the first reset control signal.

An advantage of this invention is that the phase disturbance due to missing input reference source pulses on the clock output of the PLL system that utilizes this PFD is minimized.

Another advantage of this invention is that the same circuitry can be used for either phase and frequency detection or only phase detection.

Another advantage of this invention is that the capture range can be limited to +/−180 degrees instead of +/−360 degrees based on a single enable control signal.

Yet another advantage of this invention is that it allows for both frequency locking and nearest edge locking approaches.

BRIEF DESCRIPTION OF THE DRAWINGS

The accompanying drawings, which are incorporated into and constitute a part of this specification, illustrate one or more exemplary embodiments of the present invention, and together with the detailed description, serve to explain the principles and exemplary implementations of the invention.

In the drawings.

DETAILED DESCRIPTION OF SPECIFIC EMBODIMENTS OF THE INVENTION

A specific embodiment of the present invention is described herein in the context of a phase and frequency detector (PFD) that can be a component of a PLL system. Those of ordinary skill in the art will realize that the following description of the present invention is illustrative only and is not intended to be in any way limiting. Other embodiments of the invention will readily suggest themselves to such skilled persons having the benefit of this disclosure. Reference will now be made in detail to an implementation of the present invention as illustrated in the accompanying drawings.

In the interest of clarity, not all of the routine features of the implementations herein are described. It will of course be appreciated that in the development of any such actual implementation, numerous implementation-specific decisions must be made to achieve the developers' specific goals, such as compliance with system- and business-related constraints, and that these goals will vary from one implementation to another. Moreover, it will be appreciated that such a development effort might be complex and time-consuming, but would nevertheless be a routine undertaking of engineering for those of ordinary skill in the art having the benefit of this disclosure.

Figure 4:
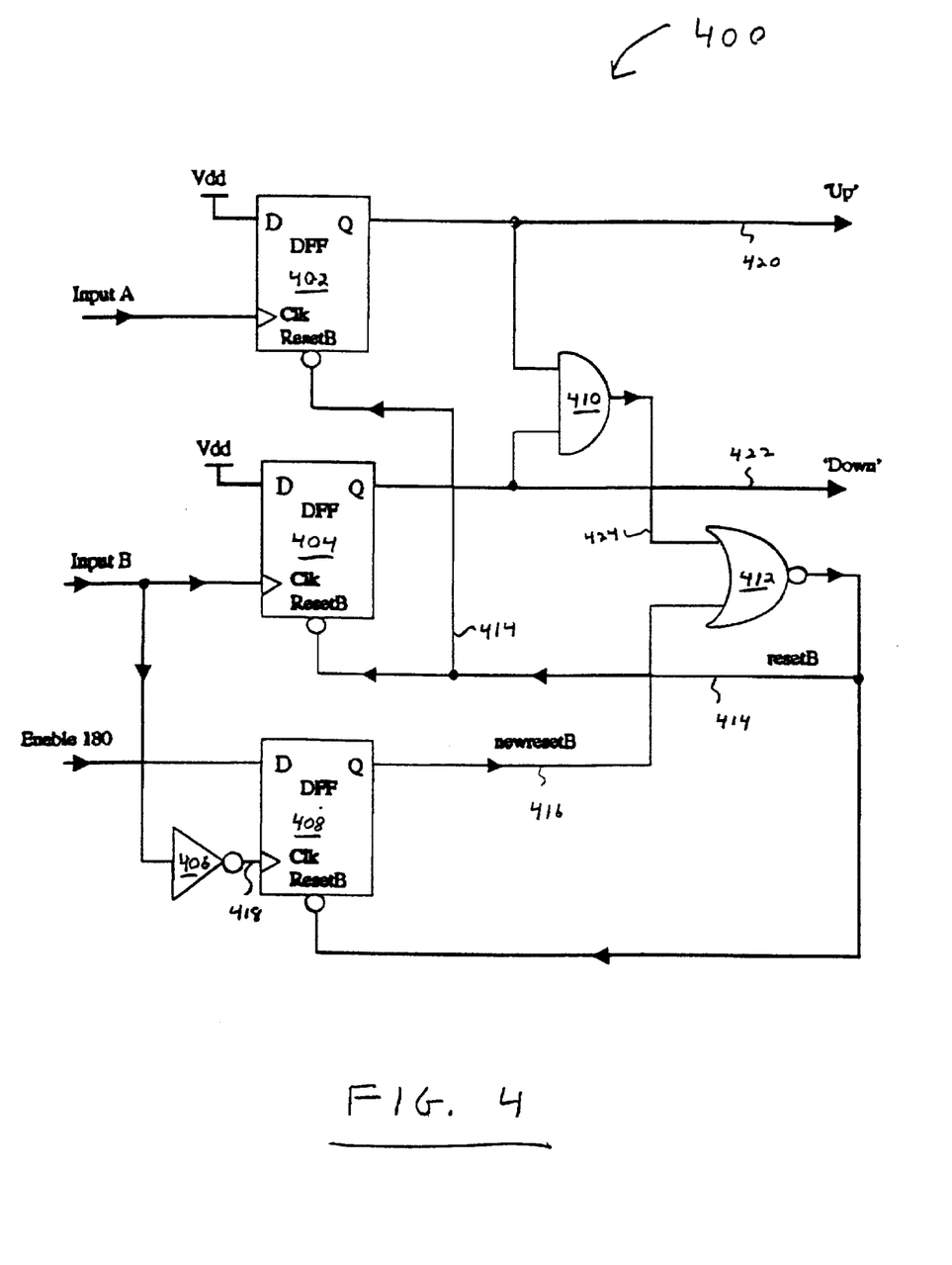
FIG. 4 is a schematic block diagram illustrative of a specific embodiment of the present invention.

FIG. 4 shows a schematic block diagram of a specific embodiment of the present invention in the system indicated by the general reference character 400. The first and second input sources shown are INPUT A and INPUT B, respectively. INPUT A can connect to the clk-input of register 402. INPUT B can connect to the clk-input of register 404 and also to the input of inverter 406. The synchronizing signal is the output 418 of inverter 406 and it can connect to the clk-input of register 408. The D-input of registers 402 and 404 can connect to the positive supply voltage, VDD. The enable control signal, ENABLE 180, can connect to the D-input of register 408. The Q-output of register 402 can connect to the first phase indicator signal 420, UP, and also to the first input of AND-gate 410. The Q-output of register 404 can connect to the second phase indicator signal 422, DOWN, and also to the second input of AND-gate 410. The phase summary signal 424 can connect to the output of AND-gate 410 and also to the first input of NOR-gate 412. The first reset control signal 414, RESETB, can connect to the output of NOR-gate 412 and also to the reset-inputs of each of the registers 402, 404, and 408. The Q-output of register 408 can connect to the second reset control signal 416, NEWRESETB, and also to the second input of NOR-gate 412. There may also be additional delay along with the AND-gate and the NOR-gate operation to assure sufficient RESETB pulse width.

Referring now to the timing diagram of FIG. 5 and viewing this diagram in conjunction with FIG. 4, the operation of the system will be described by way of example.

In the example, the INPUT A waveform 502 is shown leading the Input B waveform 504. As in the normal PFD operation, the UP signal waveform 506 can be activated upon the first transition (i.e., rising) edge of INPUT A. But, the DOWN phase indicator signal waveform 508 can enter the first INPUT A clock period time already in the high state. This can result from a previous missing INPUT A clock pulse that, due to an improper resetting mechanism, allows the system to stay in an undesirable preconditioned state. Because the UP and DOWN signals can be high together near the start of the first INPUT A clock period, this can activate the first reset control signal, RESETB, 414, the exemplary function of which is also shown in the associated waveform 510, via the first phase summary signal 424 going high as the first input to NOR-gate 412. This mechanism can reset registers 402, 404, and 408. However, the first transition (i.e., rising) edge of INPUT B can activate the DOWN phase indicator signal 422, as shown in the associated waveform 508. Thus, the system can remain in the undesirable preconditioned state.

In order to leave this preconditioned state and allow for PLL system locking to the nearest clock reference clock edge, the enable control signal, ENABLE 180, can be activated, as shown in the associated waveform 512. The second transition (i.e., falling) edge of INPUT B can then activate the synchronizing signal 418 and this can activate the second reset control signal, NEWRESETB, as shown in the associated waveform 514. The NEWRESETB activation can cause the activation of RESETB, the first reset control signal, by way of NOR-gate 412. The RESETB activation can then, in turn, reset registers 402, 404, and 408. This can deactivate both phase indicator signals, UP and DOWN.

Figure 5:
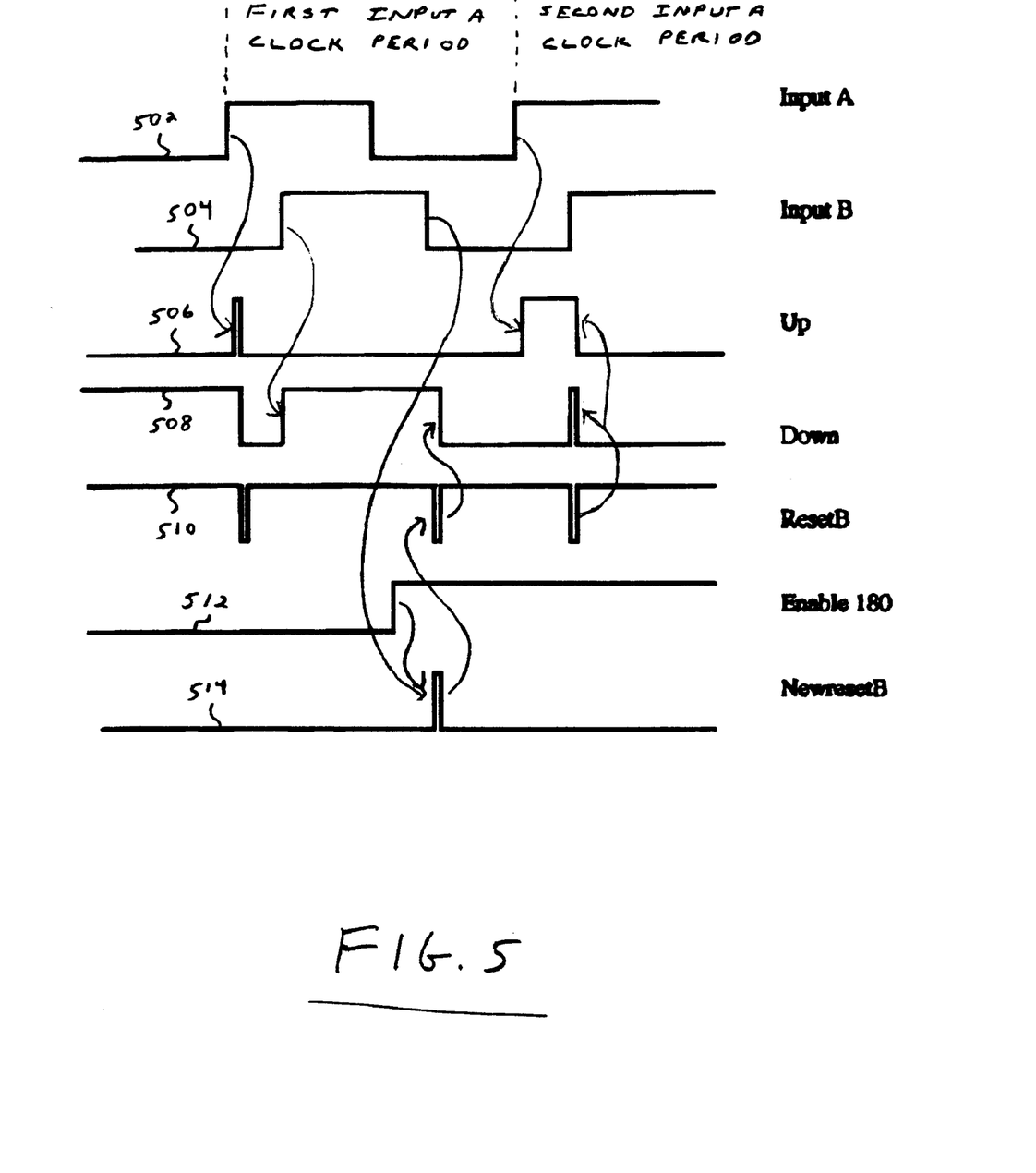
FIG. 5 is a timing diagram illustrative of the operation of the specific embodiment of FIG. 4.

By the start of the second INPUT A clock period, as shown in FIG. 5, the DOWN signal can be low and the system is no longer in the undesirable preconditioned state. The system can then operate as normal during this second INPUT A clock period. The ENABLE 180 signal can then be returned to its deactivated state.

The example shows only two input source signals, but as it is clear to one skilled in the art, more than two signals could be included in the system. Also, while the example illustrated two input source signals with the same frequency, these signals could also differ in frequency. Further, while the registers shown were D-type flip-flops, other circuit implementations could readily be substituted herein. Also, while an inversion of the INPUT B signal is shown as the synchronizing signal, other means of implementing this enable timing could be enacted. Finally, the control circuit shown could be implemented in a number of different manners or it could simply be expanded to accommodate a system with more input source signals.

While embodiments and applications of this invention have been shown and described, it would be apparent to those of ordinary skill in the art having the benefit of this disclosure that many more modifications than mentioned above are possible without departing from the inventive concepts herein. The invention, therefore, is not to be restricted except in the spirit of the appended claims.

What is claimed is:

1. A phase and frequency detector comprising:
   a first register receiving at least a first input source and a first reset control signal and outputting a first phase indicator signal;
   a second register receiving at least a second input source and the first reset control signal and outputting a second phase indicator signal;
   a third register receiving at least an enable control signal, the first reset control signal, and a synchronizing signal and outputting a second reset control signal;
   at least one AND-gate circuit receiving at least the first phase indicator signal and the second phase indicator signal and outputting a phase summary signal; and
   at least one NOR-gate circuit receiving at least the phase summary signal and the second reset control signal and outputting the first reset control signal.

2. The phase and frequency detector of claim 1, wherein:
   the synchronizing signal is the inverse of the second input source.

3. The phase and frequency detector of claim 1, wherein:
   the first register includes a D-type flip-flop (DFF) circuit.

4. The phase and frequency detector of claim 1, wherein:
   the second register includes a D-type flip-flop (DFF) circuit.

5. The phase and frequency detector of claim 1, wherein:
   the third register includes a D-type flip-flop (DFF) circuit.

6. The phase and frequency detector of claim 1, wherein:
   the first phase indicator signal is activated upon detection of a first transition edge of the first input source.

7. The phase and frequency detector of claim 1, wherein:
   the second phase indicator signal is activated upon detection of a first transition edge of the second input source.

8. The phase and frequency detector of claim 1, wherein:
   the second reset control signal is activated upon detection of:
   a second transition edge of the second input source; and
   the enable control signal in a first state.

9. The phase and frequency detector of claim 8, wherein:
   the enable control signal is placed in a first state upon detection of the phase and frequency detector in a preconditioned state.

10. The phase and frequency detector of claim 6 or 7, wherein:
    the first transition edge is the low-to-high signal transition.

11. The phase and frequency detector of claim 8 or 9, wherein:
    the first state is the logic high state.

12. The phase and frequency detector of claim 6, wherein:
    the first phase indicator signal is deactivated upon detection of the first reset control signal in a second state.

13. The phase and frequency detector of claim 7, wherein:
    the second phase indicator signal is deactivated upon detection of the first reset control signal in a second state.

14. The phase and frequency detector of claim 8, wherein:
    the second reset control signal is deactivated upon detection of the first reset control signal in a second state.

15. The phase and frequency detector of claim 12, 13, or 14, wherein:
    the second state is the logic low state.

16. An apparatus for correcting an undesirable preconditioned state in a phase and frequency detector, the apparatus comprising:
    means for generating a first phase indicator signal from a first transition edge of a first input source;
    means for generating a second phase indicator signal from a first transition edge of a second input source;
    means for generating a first reset control signal;
    means for generating a second reset control signal; and
    means responsive to the first reset control signal for resetting the means for generating the first phase indicator signal, the means for generating the second phase indicator signal, and the means for generating the second reset control signal,
    wherein the means for generating the first reset control signal includes means for combining the first phase indicator signal and the second phase indicator signal and means for combining the combination of the first and second phase indicator signals and the second reset control signal.

17. An apparatus in accordance with claim 16, wherein:
    the means for generating the second reset control signal includes means for detecting a second transition edge of the second input source and means for detecting an enable control signal in a first state.

18. An apparatus in accordance with claim 17, wherein:
    the enable control signal is placed in a first state upon detection of the phase and frequency detector being in a preconditioned state.

19. An apparatus in accordance with claim 16 or 17, wherein:
    the first transition edge is the low-to-high signal transition.

20. A method for correcting an undesirable preconditioned state in a phase and frequency detector, the method utilizing a control system comprising a first phase indicator signal generator, a second phase indicator signal generator, a first reset control signal generator, and a second reset control signal generator, the method comprising:
    generating a first phase indicator signal from a first transition edge of a first input source;
    generating a second phase indicator signal from a first transition edge of a second input source;
    generating a first reset control signal;
    generating a second reset control signal; and
    resetting the control system,
    wherein the first reset control signal is generated by combining the first phase indicator signal and the second phase indicator signal and by combining the combination of the first and second phase indicator signals and the second reset control signal.

21. A method in accordance with claim 20, further comprising:

generating the second reset control signal by detecting a second transition edge of the second input source and detecting an enable control signal in a first state.

22. A method in accordance with claim 21, further comprising:

placing the enable control signal in a first state upon detection of the phase and frequency detector in a preconditioned state.

23. A method in accordance with claim 20, further comprising:

resetting the control system by resetting of the first phase indicator signal, the second phase indicator signal, and the second reset control signal.

24. A method in accordance with claim 20 or 21, wherein:

the first transition edge is the low-to-high signal transition.

* * * * *

UNITED STATES PATENT AND TRADEMARK OFFICE
CERTIFICATE OF CORRECTION

PATENT NO. : 6,483,389 B1
DATED : November 19, 2002
INVENTOR(S) : Jonathan Lamb

It is certified that error appears in the above-identified patent and that said Letters Patent is hereby corrected as shown below:

Column 1,
Line 27, replace "modem" with -- modern --.

Column 6,
Line 14, replace "claim" with -- claims --.

Signed and Sealed this

First Day of July, 2003

JAMES E. ROGAN
*Director of the United States Patent and Trademark Office*